(12) United States Patent
Urano et al.

(10) Patent No.: US 9,343,260 B2
(45) Date of Patent: May 17, 2016

(54) MULTIPOLE AND CHARGED PARTICLE RADIATION APPARATUS USING THE SAME

(75) Inventors: Kotoko Urano, Tokyo (JP); Takeshi Kawasaki, Tokyo (JP); Noboru Moriya, Tokyo (JP); Tomonori Nakano, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 14/000,236

(22) PCT Filed: Feb. 29, 2012

(86) PCT No.: PCT/JP2012/001360
§ 371 (c)(1),
(2), (4) Date: Aug. 19, 2013

(87) PCT Pub. No.: WO2012/132228
PCT Pub. Date: Oct. 4, 2012

(65) Prior Publication Data
US 2013/0320227 A1    Dec. 5, 2013

(30) Foreign Application Priority Data

Mar. 30, 2011  (JP) ................................. 2011-073877

(51) Int. Cl.
*H01J 3/14*  (2006.01)
*H01J 37/153*  (2006.01)

(52) U.S. Cl.
CPC ....... *H01J 37/153* (2013.01); *H01J 2237/1534* (2013.01)

(58) Field of Classification Search
USPC ........................ 250/396 R, 397, 398, 396 ML
See application file for complete search history.

(56) References Cited

U.S. PATENT DOCUMENTS

2009/0039281 A1    2/2009  Kawasaki et al.
2010/0237243 A1*   9/2010  Noji et al. ..................... 250/310

FOREIGN PATENT DOCUMENTS

| JP | 2-210749 | 8/1990 |
|---|---|---|
| JP | 5-334979 | 12/1993 |
| JP | 11-339709 | 12/1999 |
| JP | 2004-241190 | 8/2004 |
| JP | 2006-139958 | 6/2006 |
| JP | 2007-287365 | 11/2007 |
| JP | 2009-43533 | 2/2009 |

* cited by examiner

*Primary Examiner* — Nicole Ippolito
*Assistant Examiner* — Hanway Chang
(74) *Attorney, Agent, or Firm* — Baker Botts L.L.P.

(57) ABSTRACT

In order to realize a multiple assembled easily with high accuracy, a multipole having assembly accuracy within 10 micrometer and within several seconds of angle is achieved by fixing multipole elements by being guided by grooves provided on an inner side of a cylindrical housing to form the multipole.

9 Claims, 7 Drawing Sheets

TOP VIEW

CROSS-SECTIONAL VIEW

MULTIPOLE AND CHARGED PARTICLE RADIATION APPARATUS USING THE SAME

TECHNICAL FIELD

The present invention relates to a charged particle beam apparatus and, more specifically, to a structure of a multipole used in an aberration corrector, a deflector, and the like.

BACKGROUND ART

In a microscope, a microfabrication apparatus, a semiconductor manufacturing apparatus, and the like in which a charged particle beam is applied, a single-stage or a multi-stage multipole (such as 2-, 4-, 6-, and 8-multipole elements) is used in a deflector of the beam and an aberration corrector. In recent years, machining on the order of several tens of nanometer or monitoring on the order of subnanometer is performed by using these charged particle beam applied apparatuses, and controlling the beam with accuracy on the order of subnanometer are required. In the deflector and the aberration corrector integrated in these apparatuses, although final adjustment is performed electrically as a matter of course, the multipole needs to be assembled with high degree of mechanical accuracy as premises therefor. Otherwise, a parasitic multipole field which may cause an aberration in addition to a multipole field required essentially for deflection or aberration correction is generated, and hence a compensation coil may be required newly for a correction thereof, or fine adjustment independent for individual multipole elements may be required. In particular, the spherical aberration corrector and the chromatic aberration corrector are required to have assembly accuracy on the order of micrometer. As a method of forming the multipole with high degree of accuracy of the related art, PTL 1 discloses a method of setting a positioning member on an optical axis, pressing and fixing multipole elements against the positioning member, and then pulling out the positioning member when manufacturing the multipole. PTL 2 discloses a system of performing positioning of a multipole by arranging a spacer having a ball shape or a cylindrical shape on the inner side of a cylindrical housing. PTL 3 discloses a system of fixing individual multipole elements on a base plate with pins, and a method of fixing integral multipole elements, and then cutting off the same by a wire cutter. PTL 4 discloses a system of fixing a multistage-connected multipole element to a base block. PTL 5 discloses a system of forming an electrostatic multipole having a metallic layer provided on an inner wall of a cylindrical ceramics cylinder as an electrode.

CITATION LIST

Patent Literature

PTL 1: JP-A-11-339709
PTL 2: JP-A-5-334979
PTL 3: JP-A-2004-241190
PTL 4: JP-A-2009-43533
PTL 5: JP-A-2006-139958

SUMMARY OF INVENTION

Technical Problem

There are problems as described below in a method of assembly or a structure of a multipole of the related art in which both high-accuracy and easy-to-assemble properties are intended.

In a method of firstly setting the positioning member on the optical axis, pressing and fix the multipole elements against the positioning member, and then pulling out the positioning member, it is difficult to pull out the positioning member if an attempt is made to suppress depressions and projections at the distal ends of the multipole elements within 10 micrometers. In order to pull out the positioning member without causing damage of the distal ends of the multipole elements, rattling is required between the positioning member and the distal ends of the multipole elements and, specifically, the larger the number of poles such as 8-multipole elements, 12-multipole element, and 20-multipole elements or the larger the number of stages, the larger rattling is required and, as a result, there is a problem that it is practically difficult to suppress the positioning accuracy within 10 micrometers.

In a structure described in PTL 2 in which the spacer having a ball shape or a cylindrical shape are arranged inside the cylindrical housing to position the multipole, the ball-shaped or cylindrical spacer and the housing can be machined with high degree of accuracy, but the number of components for assembly is significantly increased, and hence there is a problem that assembly spends time and effort. The method of fixing the spacer has also a problem. Although the spacer itself can be manufactured with significantly high degree of accuracy, a plurality of the spacers are required to be assembled simultaneously tightly within the housing, and hence assembly is difficult because the spacers cannot be held.

In contrast, if the spacers are held by machining asymmetry screw holes or the like on a circumferential surface in order to hold the spacer, there arises a problem that the positioning accuracy cannot be maintained. In addition, there is an anxiety of displacement of the spacers due to vibrations in association with shipping.

In a system of fixing the individual multipole elements to the base plate with the pins, the amount of adjustment per multipole element includes two; the distance between the optical axis and the distal end of the multipole element and the azimuth angle of the multipole element in a plane vertical to the optical axis. Adjustment thereof with at least two pins is required. Alternatively, it is also possible to adjust the distance between the optical axis and the distal end of the multipole element with a single pin and fix the azimuth angle with a guide. In any cases, in order to adjust the same on the order of micrometer, measurement and decentering machining of the pin are repeatedly required, which spends significant time and effort and the accuracy depends on the technique of a person in charge of assembly. Therefore, reproducibility is low, and a problem that mass production is not possible arises.

The system of fixing the integral multipole elements to the base plate and then cutting off the same by wire cutting process has machining accuracy on the order of micrometer and is devised to suppress the change in magnetic characteristic of the multipole elements by cutting off to a minimal level. However, since the accuracy cannot be maintained when the base plate and the multipole elements are disassembled after machining, washing is difficult. Therefore, it is suitable for manufacturing a magnetic-field type multipole used out of vacuum, but not suitable for an electrostatic type multipole used in vacuum. In addition, it is difficult to form a multi stage multipole with this method. It is because the wire becomes long, and hence achievement of accuracy with wire cutting process is more difficult.

With the method of fixing the multi stage-connected multipole elements to the base block, since the multipole elements are manufactured by wire cutting process or grinding process, assembly accuracy on the order of micrometer is easily achieved, the number of components is small, and easy-to-assemble is achieved. In a case of the electrostatic multi-stage multipole which can be applied to the multipole of any types of an electric field type, a magnetic field type, and a composite type and can form easily not only a single stage, but also multistage multipole, but requires ceramics for the base block, a ceramics-made base block formed with grooves machined with high degree of accuracy is expensive, and has a problem in terms of costs.

In the multipole formed with electrodes with metallic layer provided on the inner wall of the cylindrical ceramics, a multipole with high degree of mechanical accuracy can be formed. However, there are problems of charge-up on the inner wall of the ceramics cylinder, influence of asymmetry electric field of voltage lead-in wire, and inability of functioning as the magnetic-field type multipole.

The present application provides a multistage or a single stage multipole being easy to assemble and not requiring adjustment, requiring a small number of components, and achieving assembly accuracy within 10 micrometer.

Solution to Problem

The present invention makes an attempt to solve the above-described problems by means described below.

Multipole members formed by using a metallic material, and a cylindrical housing are provided, and a guide grooves of the same number as the number of multipole elements are provided on an upper end and a lower end of an inner wall of the cylindrical housing in parallel to an optical axis. The multipole members are inserted into the guide grooves by sliding in a direction of the optical axis, and the multipole members are fixed to the cylindrical housing with setscrews to form the multipole. Connected multipole elements formed by connecting a plurality of multipole elements via supporting members in the direction of the optical axis are used as multipole members to form a multistage multipole.

A single stage multipole may be formed in the above-described method by using the multipole elements formed of a single metal as the multipole members, and spacers having a thickness corresponding to one stage of the multipole elements as a housing.

Advantageous Effects

According to the present invention, a multipole having assembling accuracy: within 10 micrometer and within an angle of several seconds in depressions and projections of an inner diameter of the multipole and the angle of each multipole element may be realized. It is because that the shape of the multipole element and the shape of the guide groove may now be machined with mechanical accuracy of several micrometers by a wire cutter process or a grinding process, it is within the capability sufficiently of the invention to obtain the assembly accuracy as described above by combining these processes.

According to the present invention, since there is no points of adjustment because basic components for forming the multipole are only multipole elements, the cylindrical housing, and the setscrews, the multipole may be assembled in a short time with high reproducibility without variations among pieces irrespective of the skill of a person in charge of assembly.

According to the present invention, since the multipole is composed of a small number of components and has simple structure, a stable apparatus without being subjected to loosening of the multipole elements due to vibrations caused by transportation of the apparatus or heat generation caused by coils or the like may be provided.

According to the present invention, since spare multipole elements may be manufactured under the same machining conditions at the time of manufacturing the multipole elements, maintenance works such as replacement of the multipole element at the time of damage of the multipole element may be performed easily.

According to the present invention, not only the assembly accuracy is achieved, but also the displacement of the azimuth angle between the multistage multipoles are suppressed to a minimal level according to the structure, so that a high performance electron optical apparatus may be provided.

DESCRIPTION OF EMBODIMENTS

Figure 1:
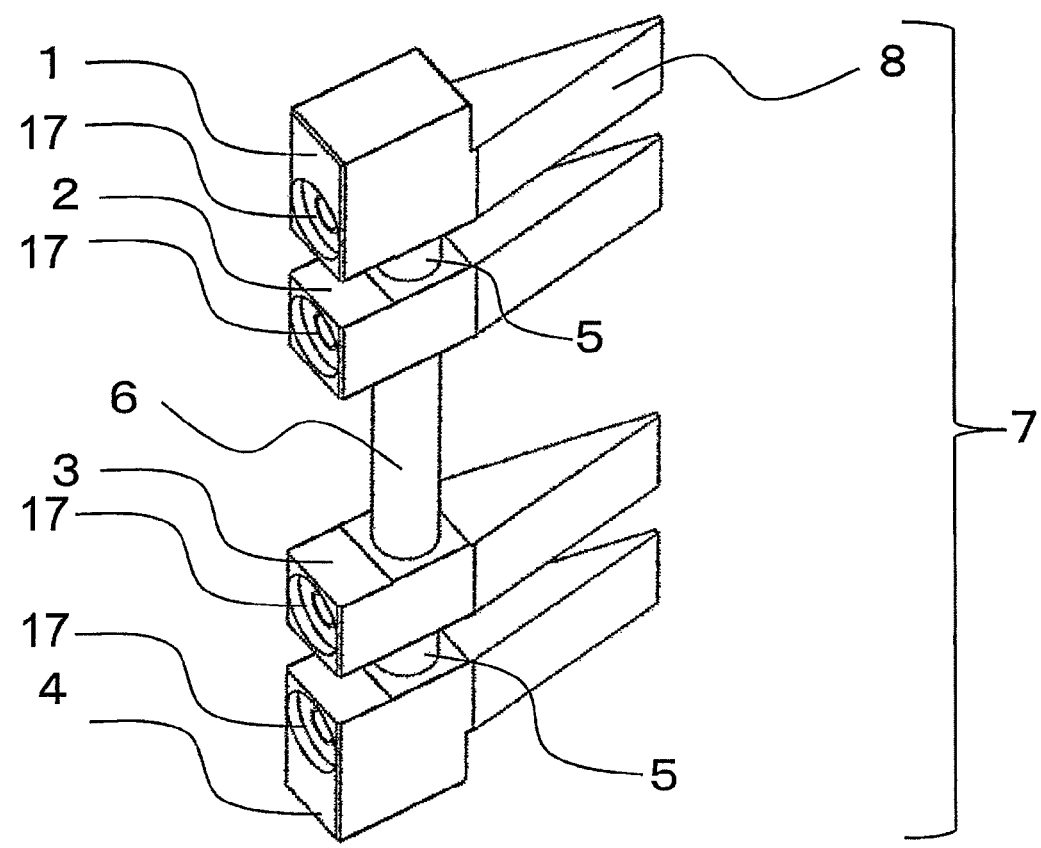
FIG. 1 is a drawing illustrating a 4-stage-connected multipole member of the present invention.

Referring now to the drawings, embodiments of the present invention will be described. In the drawings given below, the same portions are denoted by the same signs, and the duplicated descriptions will be given only when necessary.

Example 1

Referring now to a plurality of drawings, an example of a 12-multipole element 4-stage chromatic/spherical aberration corrector will be described.

FIG. 1 schematically illustrates a 4-stage-connected multipole member 7 which is one of elements of a 12-multipole element 4-stage unit of a center portion of the chromatic/spherical aberration corrector according to a first embodiment of the present invention. Examples of a material used from a multipole element 1 to a multipole element 4 include soft magnetic metal such as pure iron and permendur in addition to permalloy. These four multipole elements are integrated by brazing via alumina rods 5, 6 and form the 4-stage-connected multipole members 7. Inclined planes 8 at distal end portions of the four multipole elements are finished to have the same angle by simultaneous machining after having formed the 4-stage-connected multipole members 7. Since twelve pieces of the four 4-stage-connected multipole members are finished by using the same jigs and under the same machining condition, the 4-stage-connected multipole members 7 having the same shape can be manufactured on the order of micrometer.

Figure 2:
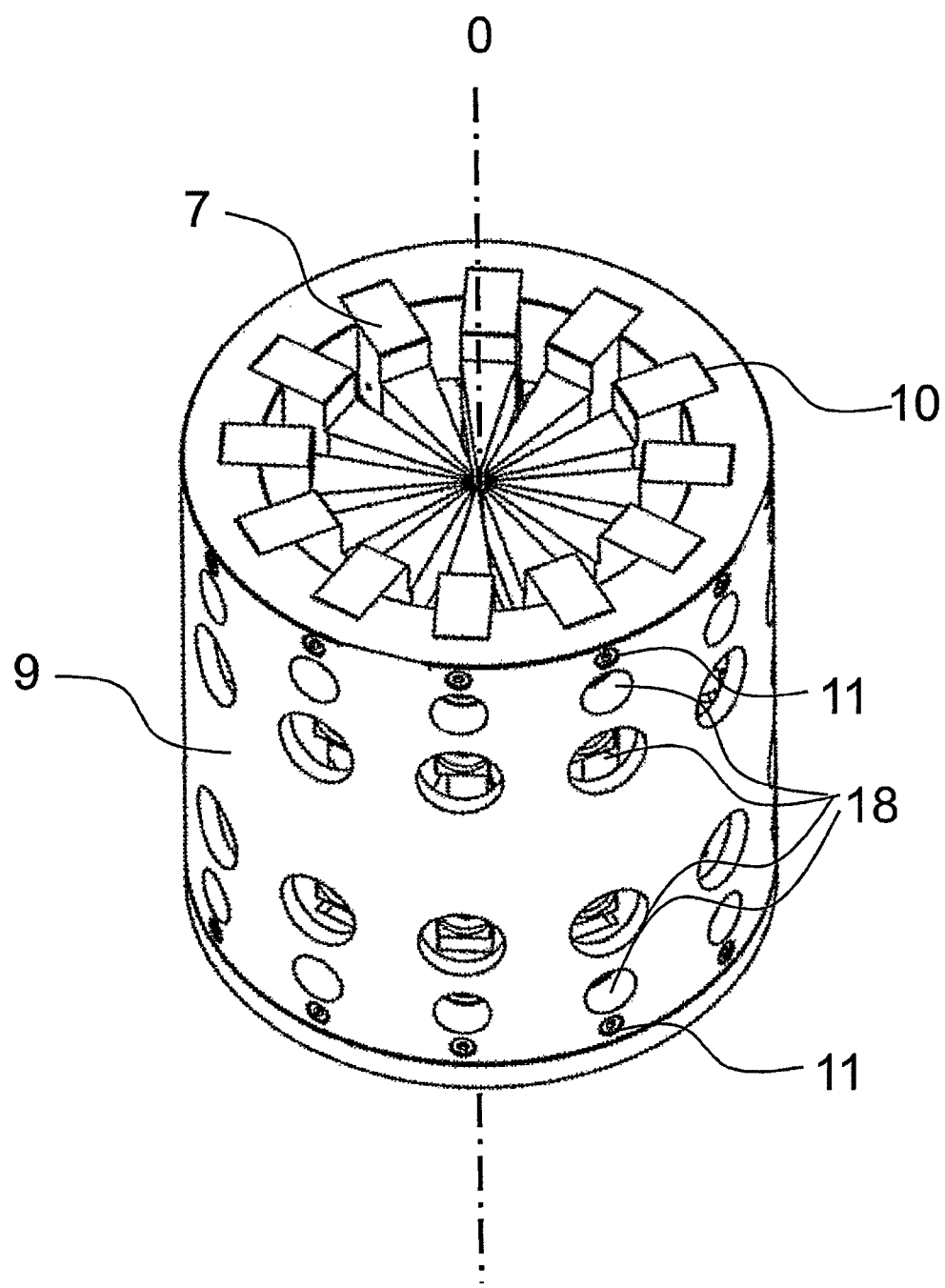
FIG. 2 is a drawing illustrating 12-multipole element 4-stage unit integrated in a cylindrical housing of the present invention.

FIG. 2 is an appearance drawing of a 12-multipole element 4-stage unit in which the 4-stage-connected multipole members in FIG. 1 are integrated into the cylindrical housing. Twelve squared groove 10 are formed on an inner periphery of an inner wall portion of both end portions of an opening of a cylindrical housing 9. The 4-stage-connected multipole members 7 are fitted into the squared grooves 10 of the cylindrical housing 9 with acute angle portions of the inclined planes 8 of the 4-stage-connected multipole members 7 faced toward an optical axis O and are slid in the direction of the optical axis O to assemble the 12-multipole elements. The first stage multipole element 1 and the fourth stage multipole element 4 are fixed to the cylindrical housing 9 with screws 11 through holes formed in the squared grooves 10. The cylindrical housing 9 is formed of a non-magnetic metal and the squared grooves 10 formed at the both end portions of the opening penetrating through the cross-section of the cylindrical housing 9 are formed so that the first stage multipole element 1 and the fourth stage multipole element 4 of the 4-stage-connected multipole members 7 are fitted. The thickness of the side wall of the cylindrical housing where the second stage multipole element 2 and the third stage multipole element 3 are arranged are reduced so that the second stage multipole element 2 and the third stage multipole element 3 do not come into contact with the cylindrical housing 9.

Figure 3:
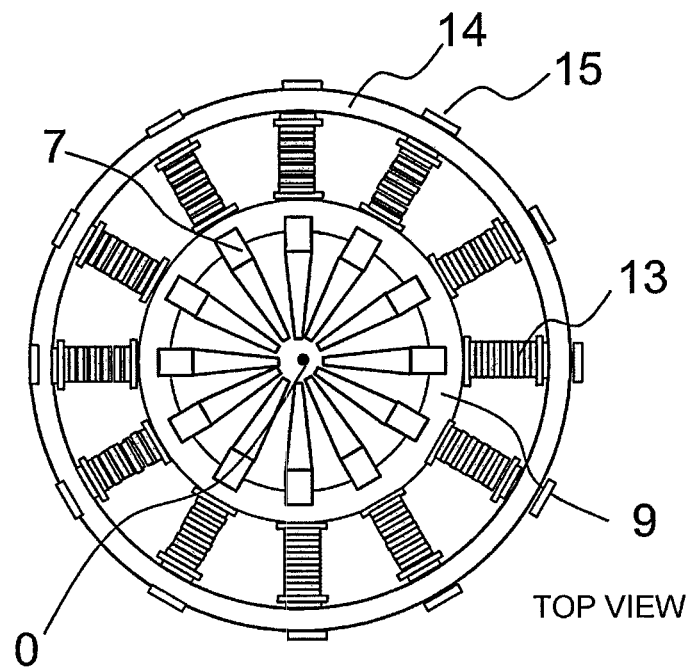
FIG. 3 is a drawing illustrating an example of a structure of a chromatic/spherical aberration corrector.
Figure 3:
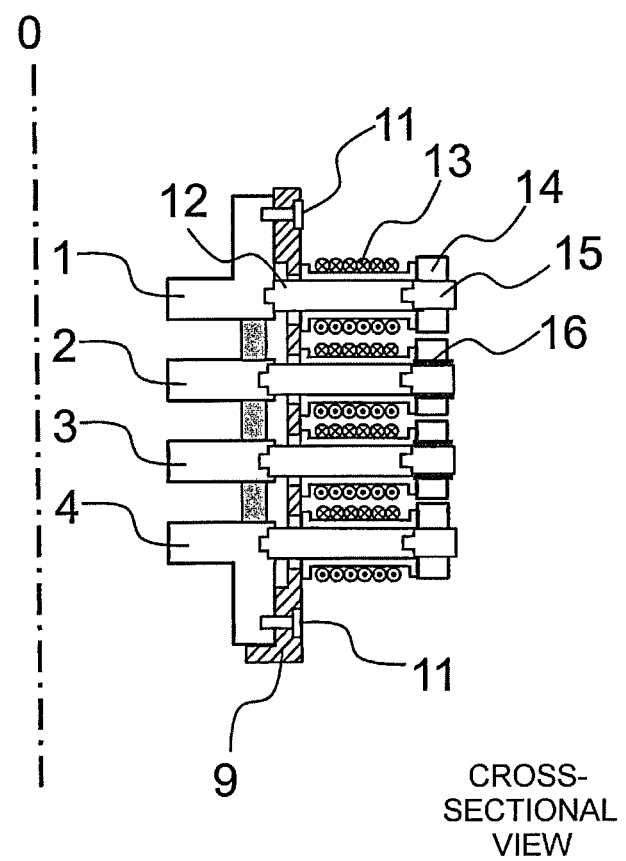

FIG. 3 illustrates a structure of the chromatic/spherical aberration corrector on which coils and magnetic yokes are mounted on the basis of the 12-multipole element 4-stage unit described in conjunction with FIG. 2. Projecting portions at distal ends of shafts 12 formed of a soft magnetic metal material on which coils 13 are wound are fitted into shaft mounting holes 17 of the multipole elements 1, 2, 3, 4 and attached to end portions of the respective multipole elements through the through holes 18 provided in the side wall of the cylindrical housing 9. Magnetic path rings 14 are each provided with holes for fixing the respective shafts 12, and a magnetic path is formed by coupling the shafts 12 and the magnetic path rings 14 by fitting connector elements 15 formed of the above-described soft magnetic metal material into these holes. In this manner, the magnetic path is formed in each stage of the multipole. A magnetic field is also applied to the multipole elements of the second stage and the third stage, so that the connector elements 15 of the second stage and the third stages are covered with insulating sleeves 16 to be insulated from the magnetic path rings 14.

The color aberration correction is performed by exciting a magnetic field 4-multipole field in the first, second, third, and fourth stages and, simultaneously, exciting an electric field 4-multipole field shifted in phase by 45° from the magnetic field 4-multipole field in the second and third stages. A spherical aberration correction is performed by exciting a magnetic field 8-multipole field in the first, second, third, and fourth stages. Since the respective multipole cannot be aligned mechanically on the order of nanometer with respect to the optical axis in the actual correction, 2-multipolar fields (acting as deflectors) are excited in the respective stages and are superimposed to electrically adjust so that a beam passes through centers of the 4-multipolar fields of the respective stages. 6-multipolar fields are excited in the respective stages to perform three-times astigmatism and axial coma aberration are performed.

Figure 4:
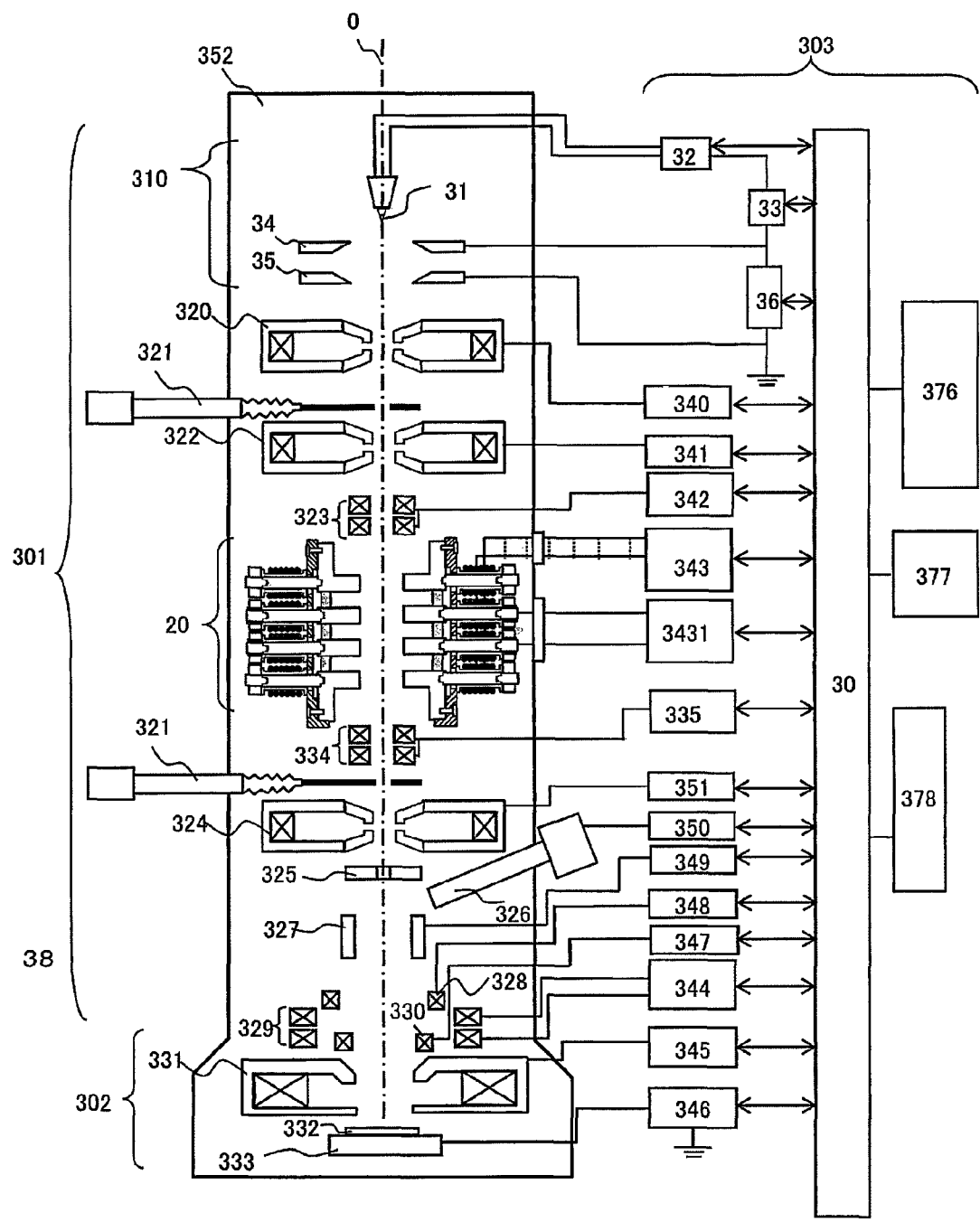
FIG. 4 is a drawing illustrating an example of a scanning electron microscope with the chromatic/spherical aberration corrector.

FIG. 4 illustrates an example in which the chromatic/spherical aberration corrector is put in a vacuum container and is integrated in a scanning-type electron microscope (hereinafter referred to as SEM). This SEM includes an SEM column 301 configured to irradiate or scan a sample with an electron beam, a sample chamber 302 in which a sample stage is stored, and a control unit 303 for controlling respective components of the SEM column 301 and the sample chamber 302. Here, illustration and description about an ion pump, a turbo-molecular pump, a vacuum tubing, and a vacuum-system control mechanism are omitted. In addition, to the control unit 303, a data storage 376 for storing predetermined information, a display monitor 377 configured to display an acquired image, and a console 378 configured to work as a man-machine interface between an apparatus and an apparatus user are connected. The console 378 is configured, for example, of information input means such as a keyboard and a mouse.

First of all, components in the interior of the SEM column 301 will be described. A field-emission electron source 31 is an electron source formed by electric field polishing distal end of monocrystal tungsten, and is configured to discharge field emission electrons by cleaning the surface by conducting heating by a flashing power supply 32 and then applying a voltage on the order of +5 kv with respect to an extraction electrode 34 in a super-high vacuum on the order of $10^{-8}$ Pa by an extraction electrode power supply 33. Electrons accelerated and converged by an electrostatic lens formed between the extraction electrode 34 and a 2nd anode 35 enters components on the downstream side along the optical axis O. The electrons are converged by a 1st condenser lens 320, are limited in amount of beam by a movable aperture 321, pass through a 2nd condenser lens 322 and a double deflector 323, and enter an aberration corrector 20. The double deflector 323 is adjusted so that axes of a field-emission electron gun 310 and the condenser lenses 320, 322 and axis of the aberration corrector 20 coincide. The beam outgoing from the aberration corrector 20 is adjusted so as to coincide with optical axes of an adjusting lens 324 and an object lens 331 by a double deflector 334.

Subsequently, the operation of the aberration corrector will be described. The aberration corrector 20 of this example is a 4-multipole element 8-multipole element system aberration corrector, and is capable of correcting the chromatic aberration and the spherical aberration. The 4-multipole element and 8-multipole element are formed in respective stages of the aberration corrector 20. However, when a 12-pole magnetic pole (which may commonly work as an electrode), 2-multipole element, 6-multipole element, 12-multipole element may also be formed by superimposition in addition to 4-multipole element and 8-multipole element. These multipole fields are used for correcting an assembly error of the electrodes and the magnetic poles, parasitic aberration generated by non-uniformity of the magnetic pole material, for example, the axial coma aberration, three-times astigmatism, four-times astigmatism.

The electron beam adjusted in angle according to a yaw corresponding to a compensation mainly of the chromatic aberration and the spherical aberration of the object lens 331 by the aberration corrector 20 is focused to a position in the vicinity of an ExB deflector 327 once by the adjusting lens 324. A cross-over is formed in the vicinity of the ExB deflector for reducing an influence of the aberration of the ExB deflector 327. Alternatively, increase in fourth-order chromatic/spherical combination aberration or fifth-order spherical aberration after the correction of the chromatic aberration and the spherical aberration is suppressed by the adjusting lens 324. Therefore, in order to obtain a high-resolution image by the aberration correction, the adjusting lens 324 is necessary. Subsequently, the electron beam is focused on a sample 332 by the object lens 331, and is caused to scan the sample by a scan deflector 329. Reference sign 328 denotes an objective aligner.

A sample stage 333 provided with a sample placing surface for placing the sample 332 is stored in the interior of the sample chamber 302. A secondary charged particles generated by irradiation of the electron beam (in this case, the secondary electrons or the reflected electrons) pass through the object lens 331, and hits onto a reflector 325, thereby generating minor particles. The generated electrons are detected by a 2nd electron detector 326. The ExB deflector 327 bends trajectories of the secondary electrons generated from the sample and guides the same directly to the 2nd electron detector 326, or adjusts the positions on the reflector 325 where the secondary electrons generated from the sample hit against and improves the detection efficiency. The detected secondary electron signal is imported into a control computer 30 as a luminance signal synchronous with scanning. The control computer 30 performs adequate processing with respect to imported luminance signal information, which is displayed on the display monitor 377 as an SEM image. Although only one detector is illustrated here, a plurality of detectors may be arranged so as to be capable of selecting reflected electrons, secondary electron energy, and angular distribution to acquire an image. The reflector 325 is not necessarily required if the coaxial disk-shaped secondary electron detectors having a hole at the center thereof are arranged on the optical axis O.

The control unit 303 includes the flashing power supply 32, the extraction electrode power supply 33, an acceleration power supply 36, a 1st condenser lens power supply 340, a 2nd condenser lens power supply 341, an adjusting lens power supply 351, a deflector power supply 342, an aberration correction coil power supply 343, an aberration corrector voltage supply 3431, a scanning coil power supply 344, an objective lens power supply 345, a retarding power supply 346, an stigma correction coil power supply 347, an objective aligner power supply 348, an ExB deflector power supply 349, and a 2nd electron detector power supply 350, and respective members are connected to corresponding components in the SEM column via signal transmission paths or electric wiring or the like.

A vacuum chamber 352 also serves as a magnetic shield, and hence is formed of a soft magnetic metal such as permalloy or, alternatively, is formed of a non-magnetic metal and is formed with a magnetic shield with a sheet metal of permalloy on the surface thereof. A coil power supply is connected to the aberration corrector 20 so that the 4-multipole element and the 8-multipole element are formed in each stage. Coils for forming 4-multipole element and for forming 8-multipole element may be wound separately on the coils 13. In this case, power supplies for the coils for the 4-multipole element and power supplies for the coils for the 8-multipole element are provided independently. When coils are not wound separately, one coil power supply corresponds to each multipole element, and the control computer 30 calculates an output current of the coil power supply for the each multipole element to create the four-multipole field or the 8-multipole field, and causes the aberration corrector coil power supply 343 to output the current accordingly. The voltages to be applied to the multipole elements in the second and third stages are also calculated in the same manner by the control computer 30, and are output by the aberration corrector voltage supply 3431.

In order to determine the amount of aberration adjustment of the aberration corrector 20, the aberration measurement of the system is required before performing the aberration correction. In order to do so, abeam is moved around an optical axis of the aberration corrector at a fixed azimuth angle (for example, 12-fraction at every 30° and the like) by the double deflector 323, whereby the SEM images of the respective cases may be analyzed to obtain aberration measurements therefor. A plurality of SEM image data are imported into the control computer 30, where the aberration is calculated. Subsequently, the control computer 30 calculates outputs from the aberration corrector coil power supply 343 and the aberration corrector voltage supply 3431 so as to compensate the calculated aberration, and emits commands to these power supplies to correct the aberration. The aberration is calculated again, and on the basis of the obtained value, the amount of aberration correction is calculated again to cause the power supplies to output the same. This process is repeated several times manually or automatically, and when all the amounts of aberration of the system becomes a preset threshold value or lower, the aberration correction is completed. As one of setting conditions of the adjusting lens 324, it is known that when an image on principal surface of the multipole element on the fourth stage of the aberration corrector 20 is projected on a principal surface of the object lens 331, the influence of the fifth-order aberration can be suppressed to a low value. Actually, since the influence of the fifth-order aberration changes significantly in blend with a beam open angle, it is not necessary to operate the adjusting lens 324 strictly under the above-described conditions, and similar conditions may be used.

Example 2

Figure 5:
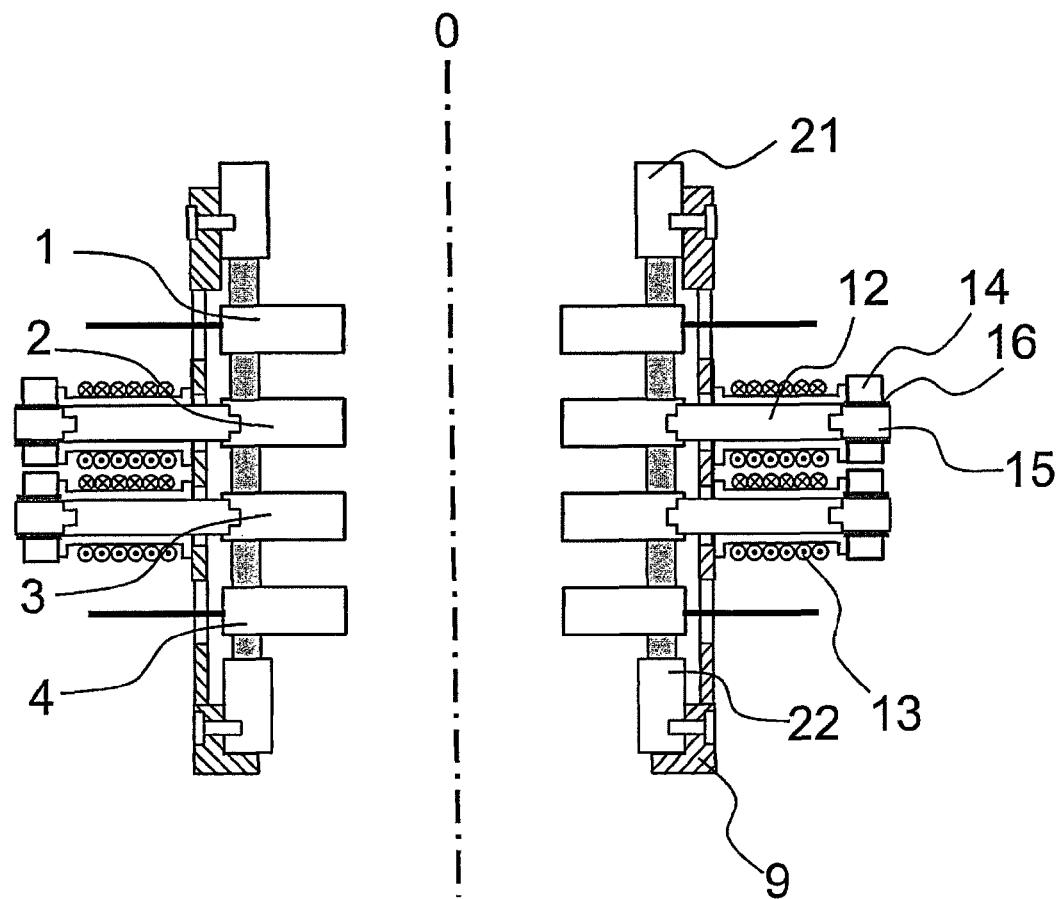
FIG. 5 is a drawing illustrating another example of the structure of the chromatic/spherical aberration corrector.

As a second example, a chromatic spherical aberration corrector mainly including 12-multipole element 4-stage electric field 4-multipole element is illustrated in FIG. 5. In this case, all of the multipole elements in the four stages need to be insulated. Therefore, metal fixtures 21, 22 for fixation to the grooves 10 are added to tops and bottoms of the four multipole elements as blazing multipole elements. Accordingly, all of the four multipole elements are insulated from the housing. The first stage and the fourth stage are connected only to the voltage source, and the multipole elements in the second and third stages are electromagnetic composite-type multipole elements, and coils for generating a magnetic field are arranged inside an outer magnetic path ring 14. The connector elements 15 are fitted into holes of the outer magnetic path rings 14 via the insulating sleeves 16 and are connected to the shafts 12. The magnetic fields leaving the multipole elements go around the inside of the magnetic path rings 14 and form a magnetic circuit. The multipole elements in the second and third stages are insulated also from an outer magnetic path, a mirror body, and other multipole elements by the insulating sleeves 16. As described thus far, the chromatic spherical aberration corrector mainly including the electric field 4-multipole elements is formed.

Figure 6:
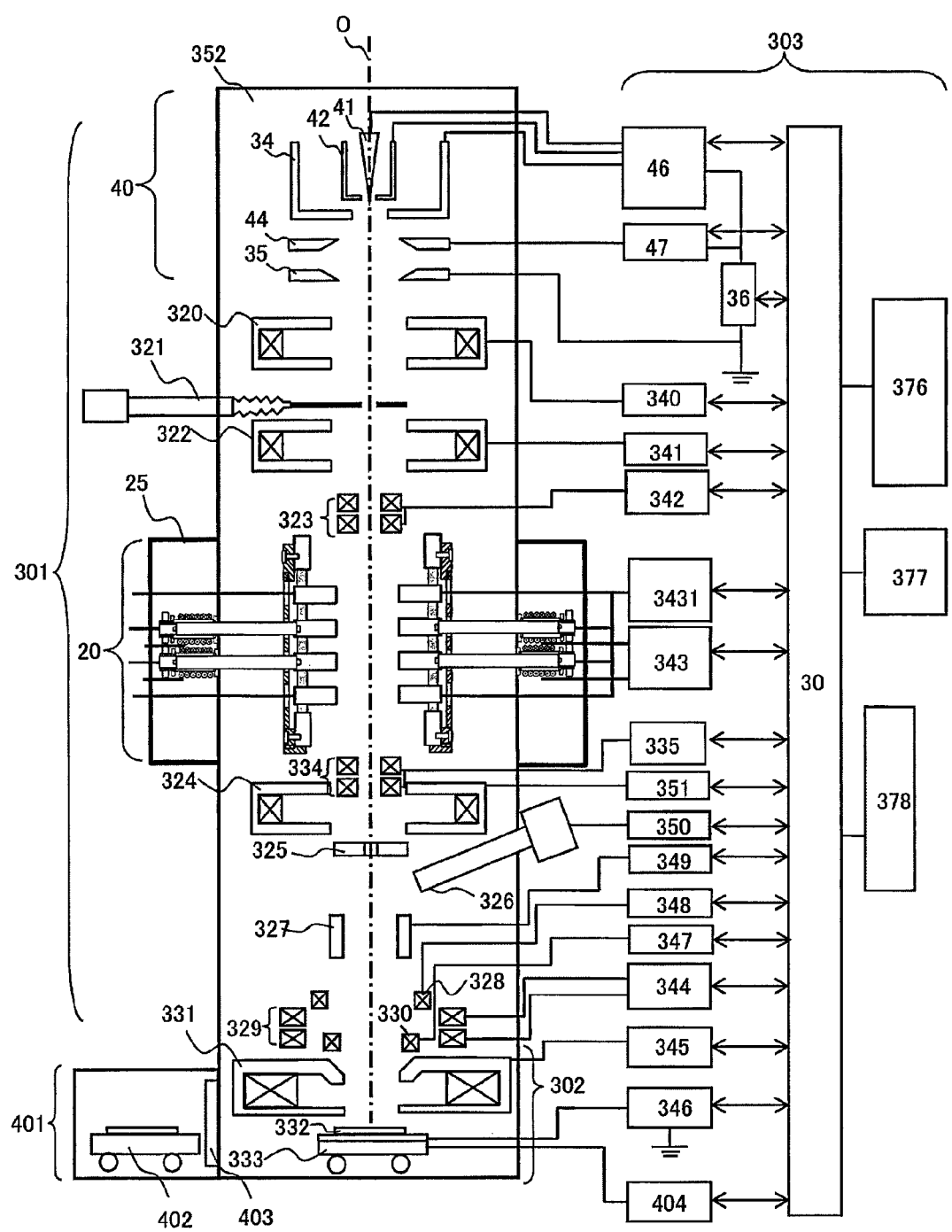
FIG. 6 is a drawing illustrating an example of a length measurement scanning electron microscope with the chromatic/spherical aberration corrector.

FIG. 6 illustrates a schematic drawing of a length measurement SEM (CD-SEM) on which the aberration corrector illustrated in FIG. 5 described above is mounted. Here, an example in which the coils 12 and the magnetic path rings 14 in the aberration corrector unit in FIG. 5 are positioned out of the vacuum is illustrated. Accordingly, a large magnetic shield 25 is required, but the coils as heat generating sources are naturally cooled down, and hence a heat drift of the magnetic pole is reduced. In addition, since an access to the coils is secured, it has a characteristic in that the maintenance work such as repairing disconnection of the coil or changing the number of turns is facilitated. Since the configuration illustrated in FIG. 6 has many common parts with the configuration illustrated in FIG. 4, only parts having a different structure will be described. In this example, a schottky-emission electron gun 40 is used. A schottky-emission electron source 41 is an electron source configured to diffuse oxygen, zirconium, and the like in tungsten monocrystal and use a schottky effect, and a suppressor electrode 42 and the extraction electrode 34 are provided in the vicinity thereof. By heating the schottky-emission electron source 41 and applying a voltage on the order of +2 kV with respect to the extraction electrode 34, schottky electrons are emitted. A negative pressure is applied to the suppressor electrode 42 so as to suppress electron emission from a portion other than a distal end of the schottky-emission electron source 41. Although the energy width and the light-source diameter are increased in comparison with the field emission electron gun, a larger probe current is secured, and hence necessity of flashing is eliminated, so that it is suitable for a continuous operation.

In the CD-SEM of this example, since a resist pattern or the like on a semiconductor wafer is measured, a landing energy is suppressed to a level not higher than 1 keV in general for use in terms of damage on samples. In the DC-SEM, a working distance is fixed, operation conditions of the aberration corrector corresponding to two or three monitoring modes different in landing energy, a retarding voltage value, and the like are stored in the data storage 376, the control computer 30 calls up selected operation conditions by being selected by an operator to set conditions of the receptive power supplies, and the monitoring modes are executed. The sample chamber 302 is provided with a load lock chamber 401 for loading a wafer, and the wafer sample passes through a gate valve 403 and is set on the sample stage 333 by a sample carrying system 402. The control computer 30 controls a sample stage control system 404 to move the stage for points of measurement input in advance, focuses with the object lens 331, corrects the astigmatism with a stigma coil 330, controls the scan deflector 329, the 2nd electron detector 326, and the like to perform operations such as length measurement, data recording, image acquisition, and data storage automatically.

Example 3

Figure 7:
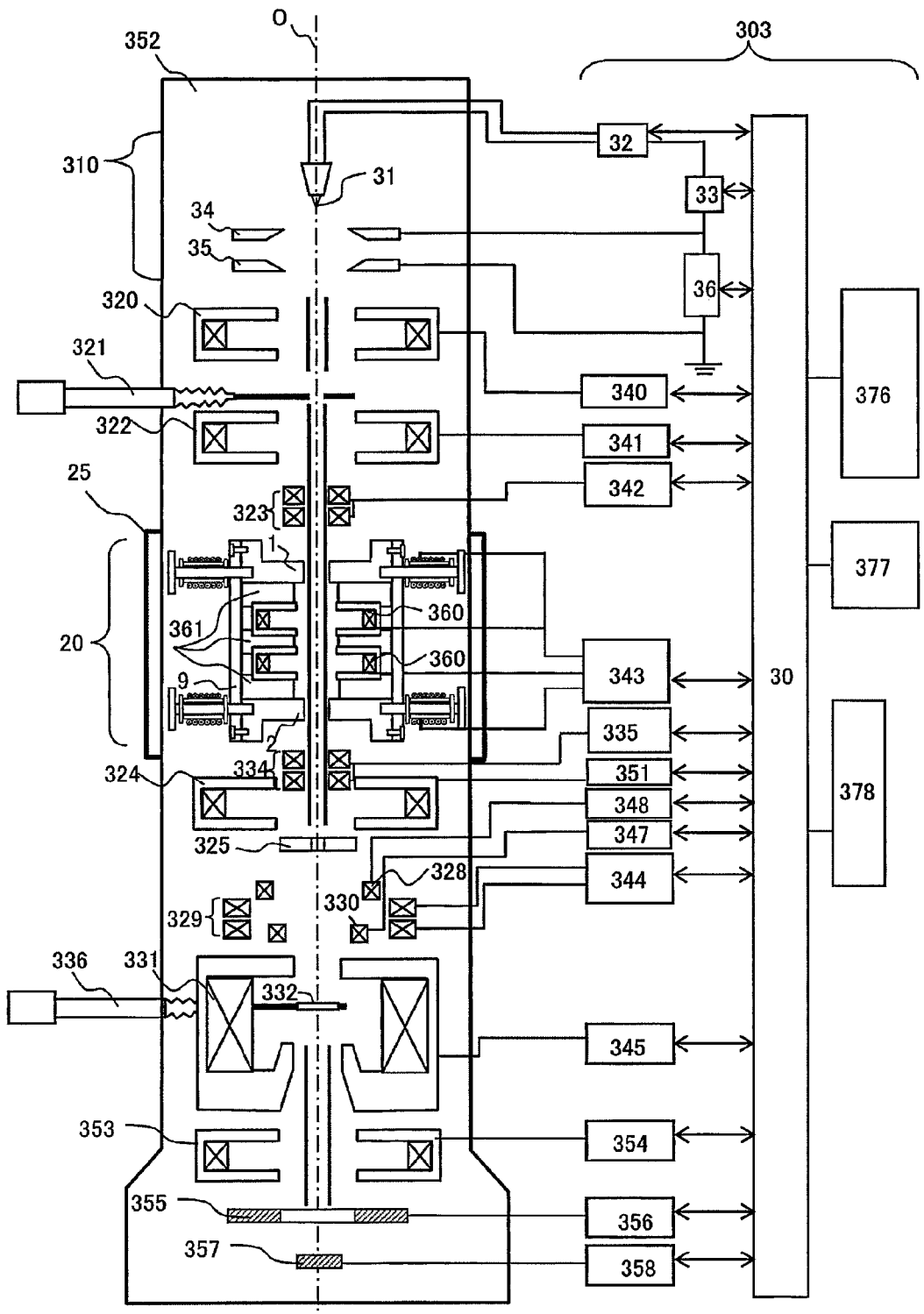
FIG. 7 is a drawing illustrating an example of a scanning transmissive-type electron microscope with the spherical aberration corrector.

As a third example, an example in which a scanning transmission electron microscope (STEM) is configured is illustrated in FIG. 7. A charged particle optical column for the STEM includes the electron gun 310 configured to generate an electron beam and emit the same at a predetermined acceleration voltage, the scan deflector 329 configured to scan the electron beam on the sample, the object lens 331 for converging the electron beam on the sample and irradiating the same, an annular detector 355 for detecting the electron beam transmitted through the sample, and an axial detector 357. Since the transmitted electrons are needed to be detected, the sample for the STEM needs to have a thin leaf form, and is arranged on an optical axis of the electron beam by a side-entry-type sample folder 336 in a state of being fixed to a mesh or the like.

In the STEM having a high-acceleration voltage, the resolution is mainly limited in the spherical aberration than the chromatic aberration, and hence the electromagnetic superimposed multipole elements need not to be used and only magnetic field type multipole are used when correcting only the spherical aberration. The spherical aberration corrector for the STEM is arranged, for example, between the electron gun and the objective lens. The aberration corrector 20 of this example is a spherical aberration corrector having a configuration in which upper and lower 6 multipole elements (or 12 multipole elements) and transfer lenses 360 are arranged in two stages therebetween. The positioning of the upper and lower multipole elements is achieved by fitting of the multipole elements 1, 2 to the squared groove of the cylindrical housing 9 as described above. Two of the transfer lenses 360 are positioned by three spacers 361. The spacers 361 each are provided with a square projection to be fitted into the squared grooves of the cylindrical housing 9, whereby easy assembly is ensured.

REFERENCE SIGNS LIST

O . . . optical axis, 1 . . . multipole element, 2 . . . multipole element, 3 . . . multipole element, 4 . . . multipole element, 5 . . . alumina rod, 6 . . . alumina rod, 7 . . . 4-stage-connected multipole member, 8 . . . inclined plane, 9 . . . cylindrical housing, 10 . . . squared grooves, 11 . . . screw, 12 . . . shaft, 13 . . . coil, 14 . . . outer magnetic path ring, 15 . . . connector element, 16 . . . insulating sleeve, 17 . . . shaft mounting hole, 18 . . . shaft through hole, 20 . . . aberration corrector, 21 . . . metal fixture, 22 . . . metal fixture, 25 . . . permalloy shield, 30 . . . control computer, 31 . . . field-emission electron source, 32 . . . flashing power supply, 33 . . . extraction electrode power supply, 34 . . . extraction electrode, 35 . . . 2nd anode, 36 . . . acceleration power supply, 301 . . . SEM column, 302 . . . sample chamber, 303 . . . control unit, 310 . . . field-emission electron gun, 320 . . . first condenser lens, 321 . . . movable aperture, 322 . . . 2nd condenser lens, 323 . . . double deflector, 324 . . . adjusting lens, 325 . . . reflector, 326 . . . 2nd electron detector, 327 . . . ExB deflector, 328 . . . objective aligner, 329 . . . scan deflector, 330 . . . stigma coil, 331 . . . object lens, 332 . . . sample, 333 . . . sample stage, 334 . . . double deflector, 335 . . . deflector power supply, 336 . . . side-entry-type sample folder, 340 . . . 1st condenser lens power supply, 341 . . . 2nd condenser lens power supply, 342 . . . deflector power supply, 343 . . . aberration corrector coil power supply, 3431 . . . aberration corrector voltage supply, 344 . . . scanning coil power supply, 345 . . . objective lens power supply, 346 . . . retarding power supply, 347 . . . stigma correction coil power supply, 348 . . . objective aligner power supply, 349 . . . ExB deflector power supply, 350 . . . 2nd electron detector power supply, 351 . . . adjusting lens power supply, 352 . . . vacuum chamber, 353 . . . projection lens, 354 . . . projection lens power supply, 355 . . . annular dark field detector, 356 . . . annular dark field detector power supply, 357 . . . axial detector, 358 . . . axial detector power supply, 360 . . . transfer lens, 361 . . . spacer, 376 . . . data storage, 377 . . . monitor, 378 . . . console, 40 . . . schottky-emission electron gun, 41 . . . schottky-emission electron source, 42 . . . suppressor electrode, 44 . . . 1st anode, 401 . . . load lock chamber, 402 . . . sample carrying system, 403 . . . gate valve, 404 . . . sample stage control system

The invention claimed is:

1. A multipole comprising a plurality of multipole elements, multipole members including the plurality of multipole elements arranged integrally with a rod, and a cylindrical housing having an opening at a center portion therethrough so as to allow a charged particle radiation to pass therethrough,
wherein the cylindrical housing includes a plurality of grooves parallel to a direction of an optical axis on a circumference of an inner wall of the opening, and the multipole members are arranged so that each multipole element in each multipole member is fitted into one of the plurality of grooves, and
wherein one or more multipole elements included in the plurality of multipole members are arranged at a portion of the cylindrical housing such that said one or more multipole elements do not come into contact with the cylindrical housing.

2. The multipole according to claim 1,
wherein the plurality of multipole elements are formed to have a multistage formed on the rod at predetermined intervals so that distal end portions thereof are oriented in the same direction, the cylindrical housing is provided with the grooves at both end portions of the inner wall of the opening, the thickness of the inner wall at an intermediate portion of the cylindrical housing is formed to be thinner than the thickness of the inner wall of the both end portions, the multipole members are fixed to the cylindrical housing between the grooves and the multipole elements at the both end portions from among the multistage multipole elements formed on the rod.

3. The multipole according to claim 2, wherein the multipole elements are formed by using a soft magnetic metal material or a soft magnetic metal material and a no-magnetic metal material, and the multipole members fixedly arrange the plurality of multipole elements at predetermined intervals parallel to the optical axis with insulating members interposed therebetween.

4. The multipole according to claim 3,
wherein the insulating members are formed of alumina, and a method of fixing the multipole elements to the rod is brazing.

5. A chromatic and spherical aberration corrector comprising:
the multipole according to claim 3 and an outer magnetic path,
wherein the multipole forms a magnetic path by being connected with the outer magnetic path via shafts having coils wound thereon.

6. The chromatic and spherical aberration corrector according to claim 5,
wherein multistage multipole having four or more stages are used.

7. A charged particle radiation apparatus comprising:
the chromatic and spherical aberration corrector according to claim 5 mounted in a vacuum atmosphere.

8. The charged particle radiation apparatus according to claim 7,
wherein the chromatic and spherical aberration corrector includes multistage multipole having four or more stages.

9. The multipole according to claim 2,
wherein multistage multipole elements having four or more stages are used.

* * * * *